(12) United States Patent
Kwak

(10) Patent No.: US 7,227,809 B2
(45) Date of Patent: Jun. 5, 2007

(54) CLOCK GENERATOR HAVING A DELAY LOCKED LOOP AND DUTY CYCLE CORRECTION CIRCUIT IN A PARALLEL CONFIGURATION

(75) Inventor: Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/250,600

(22) Filed: Oct. 14, 2005

(65) Prior Publication Data

US 2007/0086267 A1 Apr. 19, 2007

(51) Int. Cl.
*G11C 8/00* (2006.01)
(52) U.S. Cl. ............... 365/233; 327/158; 327/156; 365/226
(58) Field of Classification Search ........... 365/233, 365/226; 327/158, 156
See application file for complete search history.

(56) References Cited

U.S. PATENT DOCUMENTS

| | | | | |
|---|---|---|---|---|
| 4,527,075 A | 7/1985 | Zbinden | ...................... | 307/265 |
| 5,170,416 A | 12/1992 | Goetz et al. | .................. | 377/17 |
| 5,572,158 A | 11/1996 | Lee et al. | .................... | 327/175 |
| 5,614,855 A * | 3/1997 | Lee et al. | .................... | 327/158 |
| 5,727,037 A | 3/1998 | Maneatis | .................... | 375/376 |
| 5,757,218 A | 5/1998 | Blum | .......................... | 327/175 |
| 5,781,055 A | 7/1998 | Bhagwan | ................... | 327/270 |
| 5,828,250 A | 10/1998 | Konno | ....................... | 327/116 |
| 5,945,857 A | 8/1999 | Havens | ...................... | 327/175 |
| 6,040,726 A | 3/2000 | Martin | ....................... | 327/175 |
| 6,052,152 A | 4/2000 | Malcolm, Jr. et al. | ...... | 348/537 |
| 6,084,452 A | 7/2000 | Drost et al. | ................. | 327/175 |
| 6,125,157 A | 9/2000 | Donnelly et al. | ........... | 375/371 |
| 6,137,328 A | 10/2000 | Sung | ......................... | 327/158 |
| 6,169,434 B1 | 1/2001 | Portmann | ................... | 327/175 |
| 6,181,178 B1 | 1/2001 | Choi | ......................... | 327/175 |
| 6,194,916 B1 | 2/2001 | Nishimura et al. | ........... | 327/12 |
| 6,198,326 B1 | 3/2001 | Choi et al. | .................. | 327/263 |
| 6,201,423 B1 | 3/2001 | Taguchi et al. | ............. | 327/141 |
| 6,275,555 B1 | 8/2001 | Song | ......................... | 375/375 |
| 6,282,253 B1 | 8/2001 | Fahrenbruch | ............... | 375/371 |
| 6,285,226 B1 | 9/2001 | Nguyen | ...................... | 327/175 |
| 6,298,004 B1 | 10/2001 | Kawasaki et al. | .......... | 365/233 |
| 6,310,653 B1 | 10/2001 | Malcolm, Jr. et al. | ...... | 348/537 |
| 6,320,438 B1 | 11/2001 | Arcus | ........................ | 327/175 |
| 6,342,801 B1 | 1/2002 | Shin | ........................... | 327/175 |
| 6,384,652 B1 | 5/2002 | Shu | ............................ | 327/175 |
| 6,426,660 B1 | 7/2002 | Ho et al. | .................... | 327/175 |
| 6,433,597 B2 | 8/2002 | Jung | ......................... | 327/158 |
| 6,441,659 B1 | 8/2002 | Demone | ..................... | 327/156 |

(Continued)

*Primary Examiner*—Connie C. Yoha
(74) *Attorney, Agent, or Firm*—Dorsey & Whitney, LLP

(57) ABSTRACT

A clock generator having a delay locked loop and a duty cycle correction circuit. The delay locked loop adjusts a first adjustable delay circuit to generate a first output clock signal that is synchronized with a first input clock signal and adjusts a second adjustable delay circuit to provide a delay that is equal to the first adjustable delay circuit. A duty cycle correction circuit is coupled to the first and second inputs of the delay locked loop and further coupled to the second adjustable delay circuit. The duty cycle correction circuit is configured to determine a duty cycle error of at least one of the first and second input clock signals and adjust the second adjustable delay circuit to provide a corrected delay compensating for the duty cycle error.

38 Claims, 10 Drawing Sheets

U.S. PATENT DOCUMENTS

| | | | |
|---|---|---|---|
| 6,445,228 B1 | 9/2002 | Nguyen | 327/115 |
| 6,452,432 B2* | 9/2002 | Kim | 327/158 |
| 6,459,314 B2 | 10/2002 | Kim | 327/161 |
| 6,466,071 B2 | 10/2002 | Kim et al. | 327/175 |
| 6,496,045 B1 | 12/2002 | Nguyen | 327/115 |
| 6,498,524 B1 | 12/2002 | Kawasaki et al. | 327/158 |
| 6,507,220 B1 | 1/2003 | Groen et al. | 326/93 |
| 6,535,040 B2 | 3/2003 | Jung et al. | 327/175 |
| 6,539,072 B1* | 3/2003 | Donnelly et al. | 375/371 |
| 6,542,015 B2 | 4/2003 | Zhou et al. | 327/172 |
| 6,578,154 B1 | 6/2003 | Wynen et al. | 713/500 |
| 6,580,305 B1 | 6/2003 | Liu et al. | 327/298 |
| 6,583,657 B1 | 6/2003 | Eckhardt et al. | 327/175 |
| 6,603,337 B2 | 8/2003 | Cho | 327/149 |
| 6,605,969 B2* | 8/2003 | Mikhalev et al. | 327/158 |
| 6,625,765 B1 | 9/2003 | Krishnan | 714/718 |
| 6,628,276 B1 | 9/2003 | Elliott | 345/213 |
| 6,643,790 B1 | 11/2003 | Yu et al. | 713/500 |
| 6,677,792 B2 | 1/2004 | Kwak | 327/158 |
| 6,690,218 B2 | 2/2004 | Goldblatt | 327/175 |
| 6,711,226 B1 | 3/2004 | Williams et al. | 375/371 |
| 6,737,927 B2 | 5/2004 | Hsieh | 331/74 |
| 6,744,289 B2 | 6/2004 | Nguyen et al. | 327/115 |
| 6,750,688 B2 | 6/2004 | Takai | 327/158 |
| 6,765,421 B2 | 7/2004 | Brox et al. | 327/175 |
| 6,765,976 B1 | 7/2004 | Oh | 375/376 |
| 6,768,697 B2 | 7/2004 | Labrum et al. | 365/233 |
| 6,788,120 B1 | 9/2004 | Nguyen | 327/172 |
| 6,794,913 B1 | 9/2004 | Stengel | 327/158 |
| 6,801,067 B2 | 10/2004 | Jang | 327/161 |
| 6,801,072 B2 | 10/2004 | Guinea et al. | 327/277 |
| 6,819,155 B1 | 11/2004 | Ling et al. | 327/175 |
| 6,853,225 B2 | 2/2005 | Lee | 327/158 |
| 6,859,107 B1 | 2/2005 | Moon et al. | 331/11 |
| 6,873,199 B2 | 3/2005 | Nishimura et al. | 327/279 |
| 6,876,240 B2 | 4/2005 | Moon et al. | 327/158 |
| 6,879,923 B2 | 4/2005 | Butler | 702/104 |
| 6,882,196 B2 | 4/2005 | Yee et al. | 327/175 |
| 6,917,230 B2 | 7/2005 | Miller | 327/158 |
| 6,920,081 B2 | 7/2005 | Labrum et al. | 365/233 |
| 6,924,684 B1 | 8/2005 | Nguyen | 327/241 |
| 6,927,642 B2 | 8/2005 | Hsieh | 331/175 |
| 6,934,215 B2 | 8/2005 | Chung et al. | 365/233 |
| 6,940,328 B2 | 9/2005 | Lin | 327/175 |
| 6,958,639 B2 | 10/2005 | Park et al. | 327/175 |
| 6,963,235 B2 | 11/2005 | Lee | 327/158 |
| 6,982,581 B2 | 1/2006 | Dosho et al. | 327/175 |
| 7,005,900 B1 | 2/2006 | Nguyen | 327/122 |
| 7,005,904 B2 | 2/2006 | Minzoni | 327/175 |
| 7,015,739 B2 | 3/2006 | Lee et al. | 327/175 |
| 7,019,574 B2 | 3/2006 | Schrodinger | 327/175 |
| 7,020,228 B2 | 3/2006 | Miyano | 375/376 |
| 7,039,147 B2 | 5/2006 | Donnelly et al. | 375/373 |
| 7,046,059 B2 | 5/2006 | Kwak | 327/158 |
| 7,075,856 B2 | 7/2006 | Labrum et al. | 365/233 |
| 7,078,949 B2 | 7/2006 | Kim et al. | 327/158 |
| 7,098,714 B2 | 8/2006 | Lin | 327/291 |
| 7,116,141 B2 | 10/2006 | Demone | 327/149 |
| 7,116,143 B2 | 10/2006 | Deivasigamani et al. | 327/149 |
| 7,116,149 B2 | 10/2006 | Kim | 327/175 |
| 7,119,594 B2 | 10/2006 | Kim | 327/175 |
| 7,120,839 B2 | 10/2006 | Fayneh et al. | 714/700 |
| 2003/0080791 A1 | 5/2003 | Fiscus | 327/158 |
| 2004/0113667 A1 | 6/2004 | Jin | 327/158 |
| 2005/0028019 A1 | 2/2005 | Kim | 713/500 |
| 2005/0262373 A1 | 11/2005 | Kim | 713/401 |
| 2005/0270893 A1 | 12/2005 | Lin et al. | 365/233 |
| 2006/0044931 A1 | 3/2006 | Kim | 365/233 |
| 2006/0045227 A1 | 3/2006 | Guan | 375/376 |
| 2006/0103440 A1 | 5/2006 | Easwaran | 327/158 |

* cited by examiner

CLOCK GENERATOR HAVING A DELAY LOCKED LOOP AND DUTY CYCLE CORRECTION CIRCUIT IN A PARALLEL CONFIGURATION

TECHNICAL FIELD

The present invention relates generally to integrated circuits, and more specifically to synchronizing an external clock signal applied to an integrated circuit with internal clock signals generated in the integrated circuit in response to the external clock signal, and generating a synchronized external clock signal having a corrected duty cycle.

BACKGROUND OF THE INVENTION

In synchronous integrated circuits, the integrated circuit is clocked by an external clock signal and performs operations at predetermined times relative to the rising and falling edges of the applied clock signal. Examples of synchronous integrated circuits include synchronous memory devices such as synchronous dynamic random access memories ("SDRAMs"), synchronous static random access memories ("SSRAMs"), and packetized memories like SLDRAMs and RDRAMs, and include other types of integrated circuits as well, such as microprocessors. The timing of signals external to a synchronous memory device is determined by the external clock signal, and operations within the memory device are typically synchronized to external operations. For example, commands are placed on a command bus of the memory device in synchronism with the external clock signal, and the memory device must latch these commands at the proper times to successfully capture the commands. To latch the applied commands, an internal clock signal is developed in response to the external clock signal, and is typically applied to latches contained in the memory device to clock the commands into the latches. The internal clock signal and external clock must be synchronized to ensure the internal clock signal clocks the latches at the proper times to successfully capture the commands. In the present description, "external" refers to signals and operations outside of the memory device, and "internal" refers to signals and operations within the memory device. Moreover, although the present description is directed to synchronous memory devices, the principles described herein are equally applicable to other types of synchronous integrated circuits.

Internal circuitry in the memory device that generates the internal clock signal necessarily introduces some time delay, causing the internal clock signal to be phase shifted relative to the external clock signal. As long as the phase-shift is minimal, timing within the memory device can be easily synchronized to the external timing. However, with higher frequency clock signals, the time delay introduced by the internal circuitry becomes more significant. This is true because as the frequency of the external clock signal increases, the period of the signal decreases and thus even small delays introduced by the internal circuitry correspond to significant phase shifts between the internal and external clock signals. As a result of inherent delays, the commands applied to the memory device may no longer be valid by the time the internal clock signal clocks the latches. Additionally, as the frequency of the external clock increases, variations in the duty cycle of the clock signal introduce a greater duty cycle error. An ideal duty cycle for a clock signal is typically 50 percent. That is, over the period of a clock cycle, the clock signal is HIGH for 50 percent of the period. As the period of the clock signals become shorter due to the increased clock frequency, a clock variation that results in a subtle shift in duty cycle, and which can be ignored at a lower clock frequency, may result in a much more significant shift in the duty cycle of the higher frequency clock signal. In such instances, if the duty cycle of the clock signal is left uncorrected, timing errors may cause the memory device to fail.

To synchronize external and internal clock signals in modern synchronous memory devices, a number of different approaches have been considered and utilized, including delay locked loops ("DLLs") with duty cycle correction ("DCC") circuits, as will be appreciated by those skilled in the art. To correct duty cycle errors in clock signals, DCC circuits have been used to generate clock signals having a 50 percent duty cycle. As used herein, the term synchronized includes signals that are coincident and signals that have a desired delay relative to one another. FIG. 1 illustrates a conventional clock generator 100 having a DLL 110 and a DCC circuit 120. An input clock signal CLK represents an external clock signal applied to the DLL 110. As will be explained in more detail below, the DLL 110 generates an output clock signal CLK0 that is synchronized with the CLK signal. Due to the design of conventional DLLs, a duty cycle error in the CLK signal is carried through to the CLK0 signal. Thus, the CLK0 signal is provided to the DCC circuit 120 to correct any duty cycle error and generate an output clock signal CLKSYNC that is synchronized with the CLK0 signal and has a duty cycle corrected to 50 percent.

FIG. 2 illustrates the conventional DLL 110 and the DCC circuit 120 in greater detail. The DLL includes an input buffer 202 that provides a buffered clock signal CLKBUF in response to receiving the CLK signal. The CLKBUF signal is delayed relative to the CLK signal due to a propagation delay of the input buffer 202. The CLKBUF signal is provided to a variable delay circuit 204 that has a variable delay controlled by an adjustment signal DADJ1 generated by a shift register 206. The output clock signal of the variable delay circuit 204 is the CLK0 signal, which is delayed relative to the CLKBUF signal by the variable delay. An output clock signal CLKSYNC is fed back through a model delay 208 to provide a feedback clock signal CLKFB1. The model delay 208 adds a delay to the CLKSYNC signal, which is approximately equal to the total delay of the input buffer 202, an output buffer 240 in the DCC 120, and the delay that is injected by the DCC circuit 120 to the CLK0 signal and a CLK180 signal. A phase detector compares the CLKBUF and CLKFB1 signals, and generates a control signal DCONT1 for the shift register 206 in response to the phase difference between the CLKBUF and CLKFB1 signals. The variable delay circuit 204 is adjusted until the variable delay is sufficient to synchronize the CLKBUF and CLKFB1 signals. When the CLKBUF and CLKFB1 signals are in phase, the DLL 110 is said to be "locked." Under this condition, the timing of the CLK0 signal is such that the delay of the output buffer 240 is accommodated, and a clock signal output by the output buffer 240 would be in phase with the CLK signal. As known in the art, when the CLKBUF and CLKFB1 signals are in phase, the delay of the DLL feedback loop, generally defined by the variable delay 204 and the model delay 208, is a multiple of the period TCLKBUF of the CLKBUF signal. That is, the feedback loop delay is equal to n*TCLKBUF, where "n" is an integer value.

As previously mentioned, the CLK0 signal is provided to the DCC circuit 120 for duty cycle correction. The DCC circuit 120 includes a first variable delay 230 and a second variable delay 232, which are coupled in series. An output clock signal CLKFB2 of the variable delay 232 is compared with the CLK0 signal by a phase detector 238. The phase detector 238 generates a control signal DCONT2 that is provided to a shift register 234. The shift register 234 generates an adjustment signal DADJ2 based on the DCONT2 signal that is used to adjust both the variable delay 230 and the variable delay 232 to the same delay. When the variable delays 230, 232 have been adjusted so that the phase difference between the CLK0 and CLKFB2 signals is an odd multiple of the clock period of the CLK0 signal an output clock signal CLK180 from the first variable delay 230 is 180 degrees out of phase from the CLK0 signal. As known in the art, the delay of the feedback loop for the DCC circuit 120, which is generally defined by the variable delays 230 and 232, is equal to one period of the CLK0 signal. Thus, one-half the loop delay, that is, the delay of one of the variable delays 230 or 232, will provide a delay equal to one-half the period of the CLK0 signal, which is a clock signal 180 degrees out of phase from the CLK0 signal. The CLK0 and CLK180 signals are used by the output buffer 240 to generate the CLKSYNC signal, which is synchronized with the CLK signal and has a corrected duty cycle.

The conventional clock generator 100 places the DLL 110 and DCC circuit 120 in series with each other. This arrangement requires a clock signal to propagate through a plurality of adjustable delay lines, each of which have an adjustable delay that is potentially affected by such factors as the consumption of power or space, and by the operating limitations of the circuit.

Although the conventional clock generator 100 can successfully generate a synchronized clock signal having a 50% duty cycle, the conventional arrangement of the DLL 110 and the DCC circuit 120 is susceptible to several issues. One issue is clock jitter. Clock jitter is exhibited as small variations in the phase of the output clock signal that is generated by the clock generator 100. Clock jitter can be caused by small fluctuations or variations in the delay times of the delay stages found in adjustable delay lines, such as in the DLL 110 and the DCC circuit 120. As the delay times of the delay stages fluctuate, the resulting clock signal will drift or "jitter." The fluctuations in delay time can be caused by power supply noise, which affects the delay time of each active delay stages of an adjustable delay line. In a conventional arrangement of the DLL 110 and the DCC circuit 120, such as that shown in FIGS. 1 and 2, having multiple adjustable delay lines (such as adjustable delay lines 204, 230, 232) coupled in series can compound a clock jitter problem. That is, a clock signal output by a first adjustable delay line will have clock jitter, and is propagated through a second adjustable delay line, which also injects jitter. The resulting clock signal output by the second adjustable delay line will have a cumulative clock jitter from both the first and second delay lines. Propagating the clock signal through one more adjustable delay line will only result in generating a clock signal having yet more clock jitter.

Moreover, the cascaded structure of variable delays results in relatively high power consumption, in addition to the problems with jitter as previously described, that can be compounded by the power supply noise potentially occurring at each stage of the delay, making an undesirable situation even worse.

Other issues with the arrangement of the DLL 110 and the DCC circuit 120 of the clock generator 100 are slowness of operation and cumbersome size. The conventional clock generator 100 is slow because two different feedback loops must be locked in sequence before an acceptable CLKSYNC signal is generated. That is, in one arrangement, upon start up, the DCC 120 is synchronized before the DLL 110 is activated to provide a clock signal having the appropriate delay relative to the CLK signal. Alternatively, the DLL 110 is locked to generate a synchronized clock signal before the DCC 120 is activated for duty cycle correction. It may take the DLL 110 by itself several hundred clock cycles to obtain lock and generate a synchronized CLK0 signal. The DCC circuit 120 then takes additional time to adjust the variable delays 230 and 234 to synchronize the CLK0 signal and the CLKFB signal to provide a suitable CLK180 signal. The time for the DCC circuit 120 to lock can add a significant amount of time to the already lengthy time it takes to lock the DLL 110.

The clock generator 100 is cumbersome because the circuit includes nearly two complete DLLs. That is, a clock signal must propagate through three different variable delay circuits 204, 230, 232 of similar delay length, two phase detectors 210, 238, and two shift registers 206, 234. A variable delay typically takes up a relatively large amount of space on a semiconductor substrate on which the clock generator and other components of a memory device are formed. Having multiple variable delays of similar delay length only exacerbates the issue and can be undesirable where the general design goal is reducing circuit size.

Therefore, there is a need for an alternative clock generator that combines the functions of a DLL 110 and DCC circuit 120 that reduces the size of the circuit, supply-induced noise and operating limitations, while improving circuit performance and clock jitter performance.

SUMMARY OF THE INVENTION

The present invention is directed to a clock generator having a delay locked loop and a duty cycle correction circuit. One embodiment of the invention included a delay locked loop having first and second inputs to which first and second input clock signals are respectively applied, and the first and second input clock signals being complementary. The delay locked loop further includes first and second outputs at which the first and second output clock signals are provided and first and second adjustable delay circuits are coupled to the respective inputs and outputs. The delay locked loop is configured to adjust the first adjustable delay circuit to generate a first output clock signal that is synchronized with the first input clock signal and configured to adjust the second adjustable delay circuit to provide a delay that is equal to the first adjustable delay circuit. The clock generator also includes a duty cycle correction circuit that is coupled to the first and second inputs of the delay locked loop and further coupled to the second adjustable delay circuit. The duty cycle correction circuit is configured to determine a duty cycle error of at least one of the first and second input clock signals and adjust the second adjustable delay circuit to provide a corrected delay compensating for the duty cycle error.

DETAILED DESCRIPTION OF PREFERRED EMBODIMENTS

Embodiments of the present invention are directed to a clock generator that includes a DCC circuit that is connected in parallel to a DLL, and functions independently of the DLL. By separating the locking function and duty cycle correction, the time for generating stable, synchronized, duty cycle corrected clock signals is improved and power and area consumption are reduced. Additionally, clock jitter due to power supply noise is reduced due to using shorter delay lines for duty cycle correction. In the following description, certain details are set forth below to provide a sufficient understanding of the invention. However, it will be clear to one skilled in the art that the invention may be practiced without these particular details. In other instances, well-known circuits, control signals, timing protocols, and software operations have not been shown in detail or omitted entirely in order to avoid unnecessarily obscuring the invention.

Figure 1:
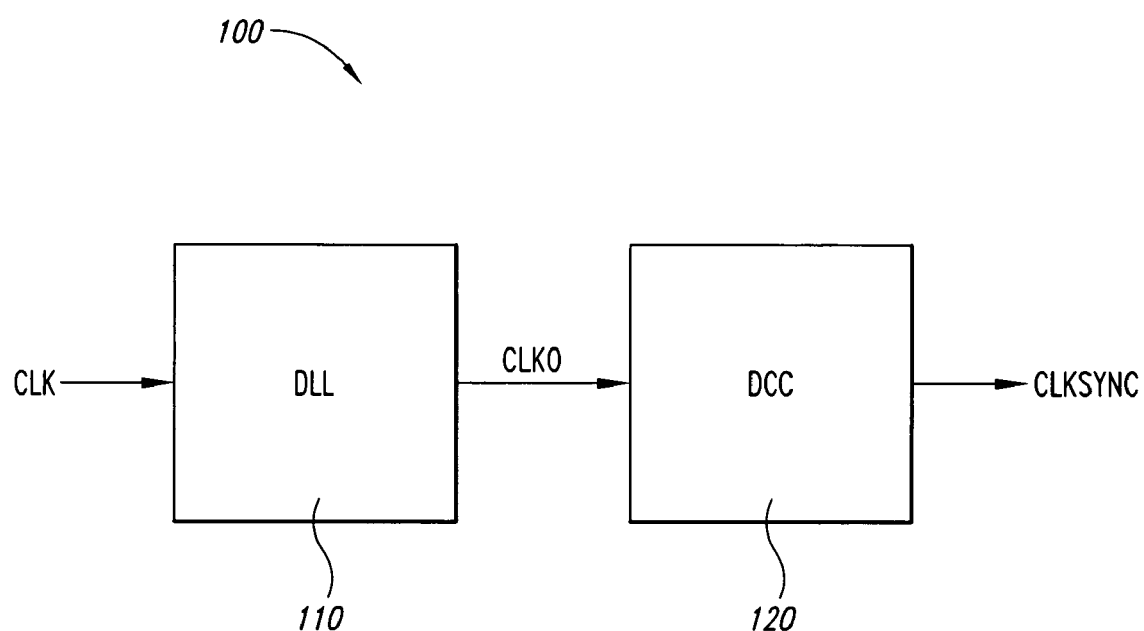
FIG. 1 is a functional block diagram of a conventional clock generator.
Figure 2:
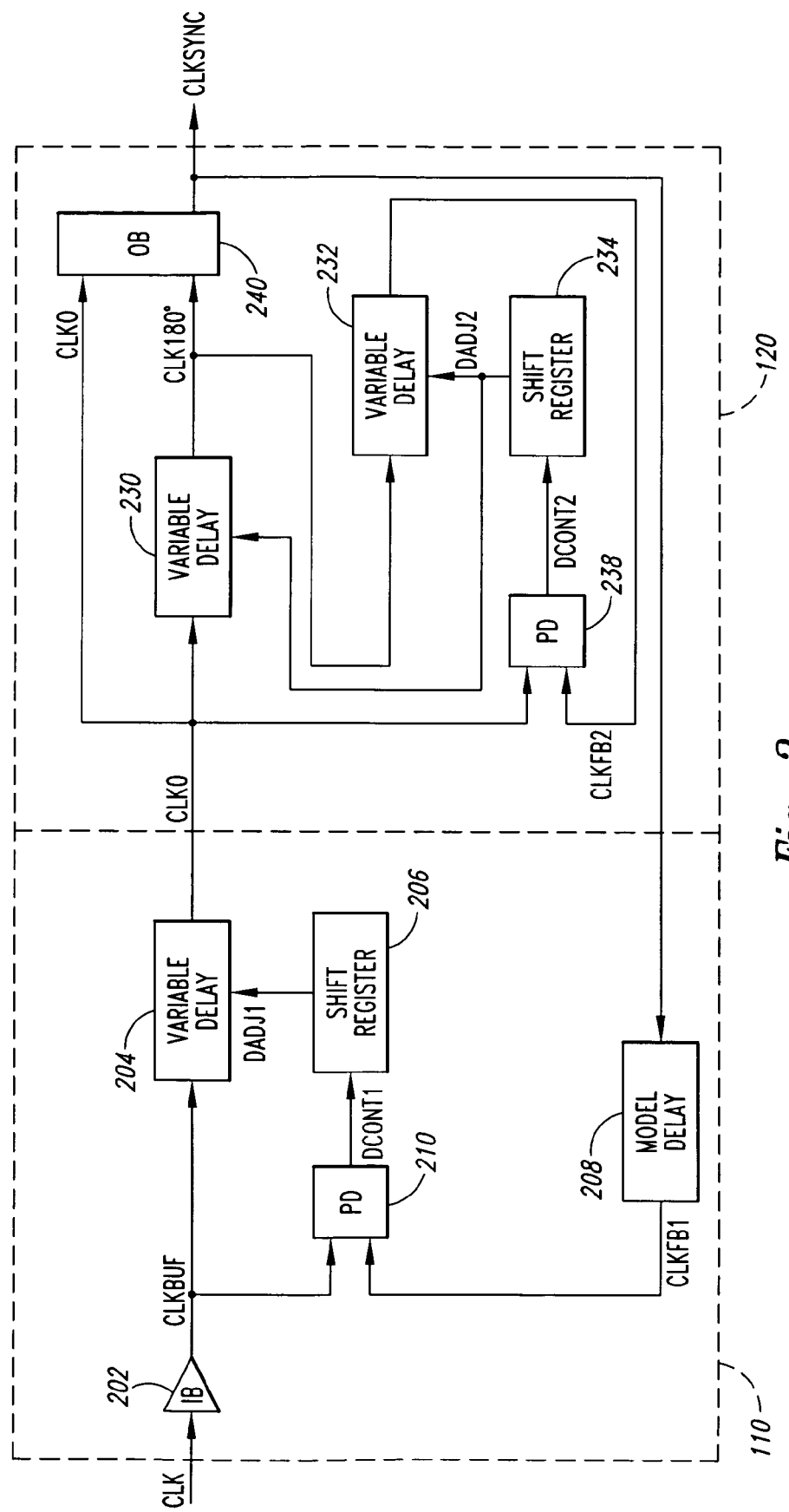
FIG. 2 is a functional block diagram of a conventional clock generator having circuitry for a conventional delayed lock loop and duty cycle correction.
Figure 3:
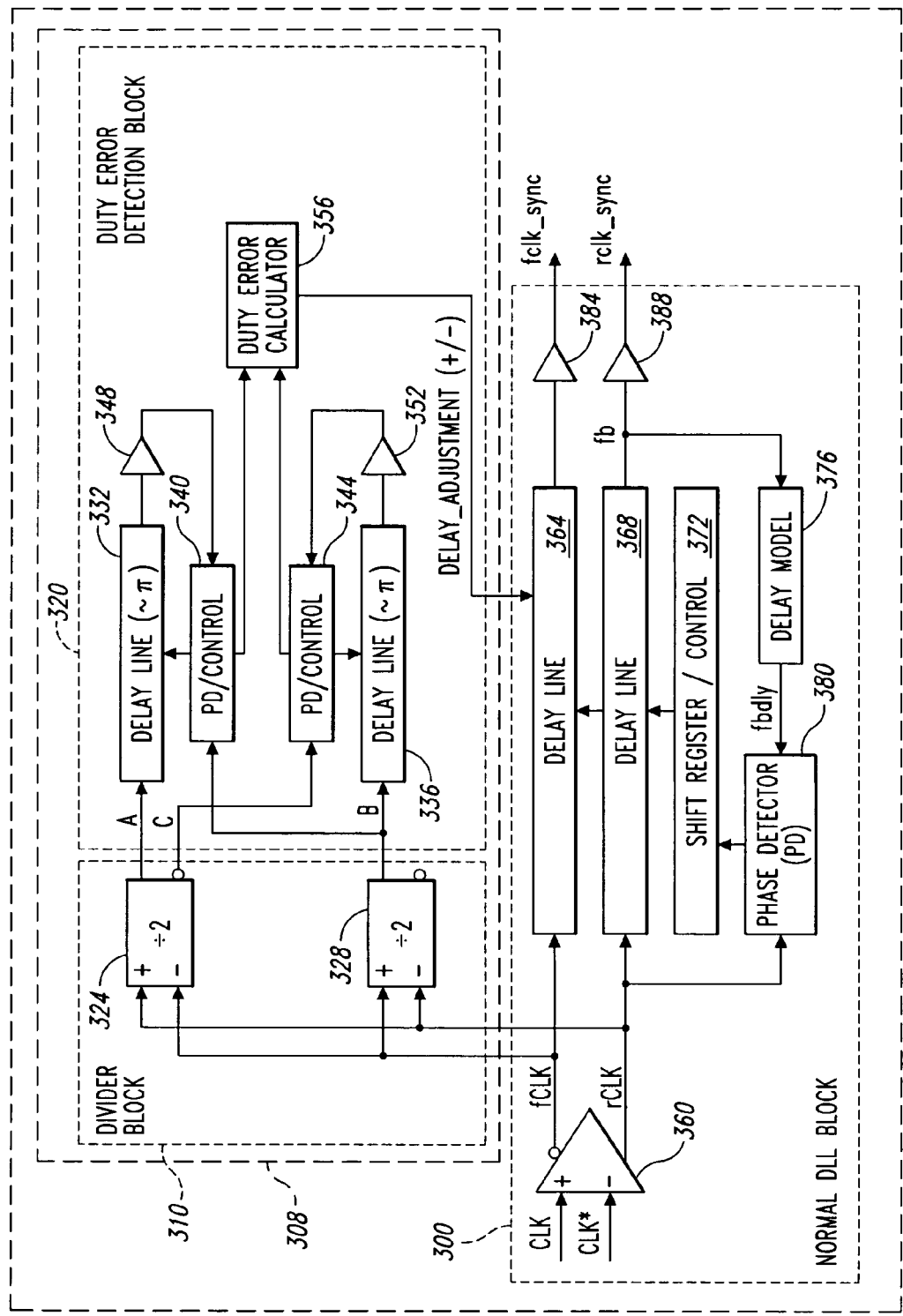
FIG. 3 is a functional block diagram of a clock generator according to an embodiment of the invention.

In contrast to conventional embodiments, FIG. 3 illustrates a DLL 300 and DCC circuit 308 configured to function simultaneously and independently of each other. The parallel operation is made possible by propagating buffered complementary input signals rCLK and FCLK to both the DLL 300 and DCC circuit 308 as they are generated. While the DLL 300 is conventional, and the description provided herein is for the purpose of describing how the "locking" mechanism is achieved as it relates to the present invention. The DCC circuit 308 is then described with respect to detecting duty error and calculating the necessary adjustments to generate an output signal with a corrected duty cycle. The signals generated by the DLL 300 and DCC circuit 308 will be more specifically described using the timing diagram in FIG. 4 to compare circuit signals before the locking operation and after the locking and corrections have been made. The operation of the duty error detection and calculation will then be further explained in greater detail with reference to the timing diagram of FIG. 5 and block diagram of FIG. 6.

Figure 4:
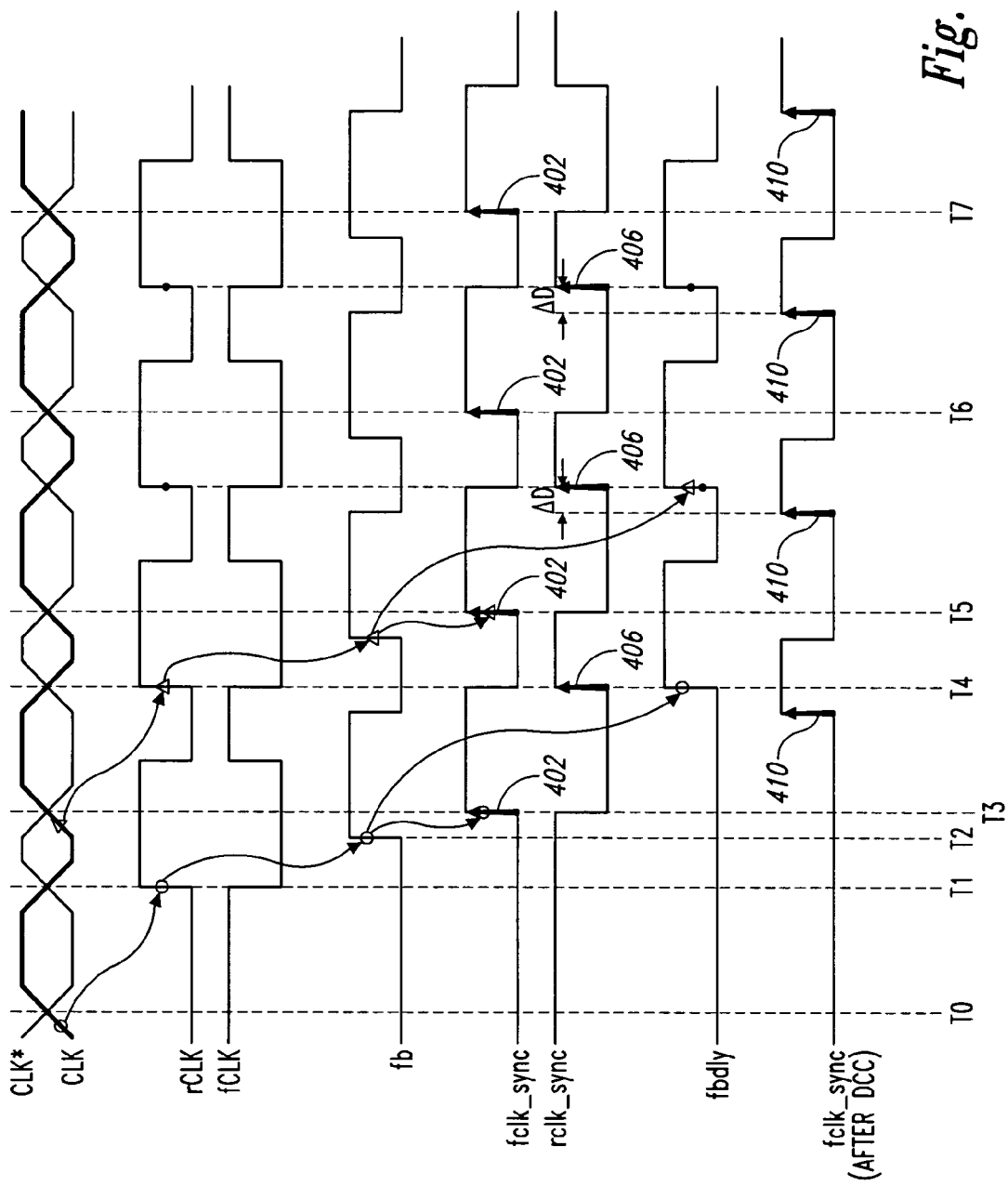
FIG. 4 is a timing diagram of various signals during operation of the clock generator of FIG. 3 according to an embodiment of the invention.

One embodiment of a clock generator 302 generating duty cycle corrected complimentary clock signals in accordance with the present invention is illustrated in FIG. 3. The clock generator 302 includes a DLL 300 and a DCC circuit 308, having a divider block 310, and a duty error detection block 320. The DLL 300 functions in the same manner as described previously for the conventional DLL 120, but is further described in detail as it relates to the present embodiment of the invention. Like the conventional DLL 120, the DLL 300 includes an input buffer 360, but receives input clock signals CLK and CLK*. The CLK and CLK* signals are complementary clock signals and are shown in FIG. 4 as not having 50% duty cycles. Buffered clock signals rCLK and fCLK are generated by the input buffer 360 in response to the CLK and CLK* signals. Generally, the rising and falling edges of the rCLK and fCLK signals correspond to the crossing of the rising and falling edges of the CLK and CLK* signals. The rCLK and fCLK signals are delayed relative to the CLK and CLK* signals by the inherent propagation delay of the input buffer 360. The propagation delay of the input buffer 360 is the delay between time T0 and T1 shown in FIG. 4. Additionally, as shown in FIG. 4, the duty cycle error of the CLK and CLK* signals is also propagated by the input buffer 360 to the rCLK and fCLK signals.

In contrast to the conventional DLL 120, the DLL 300 includes two delay lines that each corresponds to one of the buffered input signals rCLK and fCLK. The rCLK signal is provided to the adjustable delay 368 to generate a feedback signal fb that is delayed relative to the rCLK signal by an adjustable delay of the adjustable delay line 368. The delay is shown in FIG. 4 as delay between time T1 and T2. The fb signal is further delayed through a model delay 376 to provide a delayed feedback signal fbdly to the phase detector 380. The delay of the model delay 376 is shown in FIG. 4 as the delay between times T2 and T4. As known, the delay of the model delay 376 is generally equal to the total propagation delay of the input buffer 360 and the output buffer 388, 384. The phase detector 380 determines the phase difference between the rCLK signal and the fbdly signal and generates a control signal indicative of the phase difference that is provided to the shift register/control circuit 372. Using the control signal, the shift register/control circuit 372 adjusts the delay of the adjustable delay line 368 until the rCLK and fbdly signals are in phase. FIG. 4 illustrates the case when the delay of the adjustable delay line 368 has already been adjusted accordingly, as shown by the alignment of the rising clock edges of the rCLK signal and the fbdly signal at time T4. When this occurs, the DLL 300 is described as obtaining a "locked" state, and the total delay of the fb signal relative to the CLK signal is such that an output clock signal rclk_sync, which is delayed relative to the fb signal by the propagation delay of the output buffer 388 (shown in FIG. 4 as the delay between times T2 and T3), is in phase, or synchronized, with the CLK signal. The rclk_sync signal is shown in FIG. 4 when the DLL 300 is locked, as illustrated by the alignment of the rising edges of the rclk_sync signal with the crossing of the rising edge of the CLK signal and the falling edge of the CLK* signal at times T3, T5, and T6.

The adjustable delay line 364, which provides a delay to the FCLK signal, is adjusted by the shift register/control circuit 372 to have the same delay as the adjustable delay line 368. As a result, the output clock signal fclk_sync is delayed relative to the fCLK signal by the same amount as the rclk_sync signal is delayed relative to the rCLK signal. Thus, as shown in FIG. 4, the output clock signal fclk_sync is also synchronized with the CLK* signal and the complementary relationship between the rCLK and fCLK signals is maintained by the rclk_sync and fclk_sync signals.

Although the rclk_sync and fclk_sync signals are synchronized with the CLK and CLK* signals, the duty cycle of the rclk_sync and fclk_sync signals is not 50%. As will be explained in more detail below, the DCC circuit 308 adjusts the delay of the adjustable delay line 364 to provide duty cycle corrected complementary clock signals. That is, although the respective duty cycles of the rclk_sync and fclk_sync signals remain uncorrected, duty cycle error correction is provided by changing the timing of one of the output clock signals relative to the other output clock signal to provide rising clock edges of the output clock signals corresponding to clock edges of a clock signal having a 50% duty cycle.

Arrows 402 correspond to the rising edges of the rclk_sync signal, which as previously discussed, is synchronized with the CLK signal. Arrows 406 correspond to the rising edges of the fclk_sync signal, which is synchronized with the CLK* signal. As shown in FIG. 4, the rising edges of the uncorrected fclk_sync signal do not occur half-way between the rising edges of the rclk_sync signal, as would be the case where the rclk_sync and fclk_sync signals have 50% duty cycles. However, by adjusting the delay of the adjustable delay line 364, the fclk_sync signal can be shifted relative to the rclk_sync signal to provide rising edges that model a 50% duty cycle. Such a corrected fclk_sync signal is shown in FIG. 4 as fclk_sync (after DCC). Due to an adjustment ΔD made by the DCC circuit 308 to the adjustable delay line 364, the fclk_sync (after DCC) signal has rising edges, represented by arrows 410, that occur half-way between the rising edges of the rclk_sync signal (corresponding to times T5, T6, T7), as for the case where the rclk_sync and fclk_sync signals actually have a 50% duty cycle.

An embodiment of the duty error correction mechanism for this invention consists of a divider block 310 and duty error detection block 320. The divider block 310 includes frequency divider circuits 324, 328 for generating three clock signals A, B, and C, having one-half the clock frequency of the rCLK and fCLK signals. The rCLK and fCLK signals are provided to each of the divider circuits 324, 328. The divider circuit 324 receives the rCLK signal at a rising edge input (designated by a "+" symbol) and receives the fCLK signal at a falling edge input (designated by a "−" symbol). The divider circuit 324 generates the clock signal A by making a clock transition in the clock signals in response to the combination of a rising edge of the rCLK signal and a falling edge of the fCLK signal. The divider circuit 324 further generates the clock signal C, where the signal C is inverse of the signal A. Similarly, the divider circuit 328 generates the clock signal B by making a clock transition in the clock signals in response to a rising edge of the fCLK signal and a falling edge of the rCLK signal.

The duty error detection block 320 then receives the clock signals A, B, and C from the divider block 310. The duty error detection block includes two adjustable delay lines 332, 336, to provide adjustable delays for the clock signals A and B. In one embodiment, each adjustable delay lines 332, 336 is adjustable to provide no more than half of the adjustable delay of delay lines 364, 368 in the DLL 300. Adjustable delay lines having maximum adjustable delays other than approximately one-half the maximum delay of the delay lines 364, 368 can also be used. Using adjustable delay lines of approximately one-half the adjustable delays of the DLL has the benefits of reducing the area occupied by the adjustable delay lines 332, 336. The delay line 332 of the duty error detection block 320 receives and delays the signal A, which is then sent to a phase detector 340. The phase detector 340 receives the signal B and the delayed signal A and generates a signal representing the phase difference of the two signals. Similarly, the delay line 336 of the duty error detection block 320 receives and delays the signal B, which is then sent to a phase detector 344. The phase detector 344 receives the delayed signal B and the signal C and generates a signal representing the phase difference of the two signals. The difference signals from the phase detectors 340, 344 are provided to the adjustable delay lines 332, 336, respectively, to adjust the delay to put the delayed signal A in phase with the signal B and to put the delayed signal B in phase with the signal C. The difference signals from the phase detectors 340, 344 are also provided to the duty error calculator 356 to calculate the delay adjustment necessary to correct the duty cycle of the output clock signals of the DLL 300. The duty error calculations are further discussed in the following sections.

The DCC circuit 308 and the DLL 300 are coupled in a parallel configuration. This allows for a parallel operation of the DLL 300 and the DCC circuit 308. By having a configuration where duty cycle error correction occurs in parallel with the locking of the DLL 300, the time for generating stable, duty cycle corrected clock signals is improved and power and area consumption are reduced compared to conventional series connected DLL and DCC. Additionally, the parallel arrangement of the adjustable delay lines 332, 336 of the DCC circuit 308 to the adjustable delay lines 364, 368 of the DLL 300 reduces the clock jitter due to power supply noise. That is, variations in delay time due to the effect of power supply noise on the delay stages of an adjustable delay line are minimized because any delay variations are limited to the one adjustable delay line used in generating an output clock signal, namely the delay line 364 for the fclk_sync signal and the delay line 368 for the rclk_sync signal. In contrast, in a conventional arrangement of the DLL 120 and DCC circuit 120, a clock signal is typically propagated through a plurality of adjustable delay lines, each of which having an adjustable delay potentially affected by power supply noise at each delay stage and injecting clock jitter.

The operation of the duty error calculation, which occurs in the duty error detection block 320, will now be described with reference to the timing diagram of FIG. 5. The input clock signals CLK and CLK* are complementary to each other and exhibit a notable distortion in the duty cycle. At the rising edge of the CLK signal, such as at time T0, the rCLK signal transitions high and at the falling edge of the CLK signal, such as at time T1, the RCLK signal transitions low. Similarly, the fCLK signal, which is out of phase by 180° with respect to the rCLK signal, transitions high and low relative to the rising and falling edges of the CLK* signal. As known, the RCLK and fCLK signals will be delayed relative to the CLK and CLK* signals respectively, due to the inherent propagation delays of the input clock buffer 360. However, in order to simplify the timing diagram of FIG. 5, the rCLK and fCLk signals are not shown as being delayed relative to the CLK and CLK* signals. Those ordinarily skilled in the art will nevertheless obtain sufficient understanding from the descriptions provided herein to practice embodiments of the invention despite the simplification to FIG. 5.

As previously discussed, the divider circuit 324 generates the clock signal A having transitions when a rising edge of the rCLK signal crosses a falling edge of the fCLK signal, as occurs at times T0, T2, and T4. As a result, the clock signal A generated by the divider circuit 324 has a frequency that is half of the frequency of the rCLK and fCLK signals and has a 50% duty cycle. The signal C is the inverse of the signal A as previously discussed, and is also generated by the divider circuit 324. In contrast, the divider circuit 328 generates the clock signal B having transitions when a rising edge of the fCLK signal crosses a falling edge of the rCLK signal, such as at times T1 and T3. As a result, the clock signal B generated by the divider circuit 328 has a frequency that is half the frequency of the rCLK and fCLK signals and has a 50% duty cycle.

Figure 5:
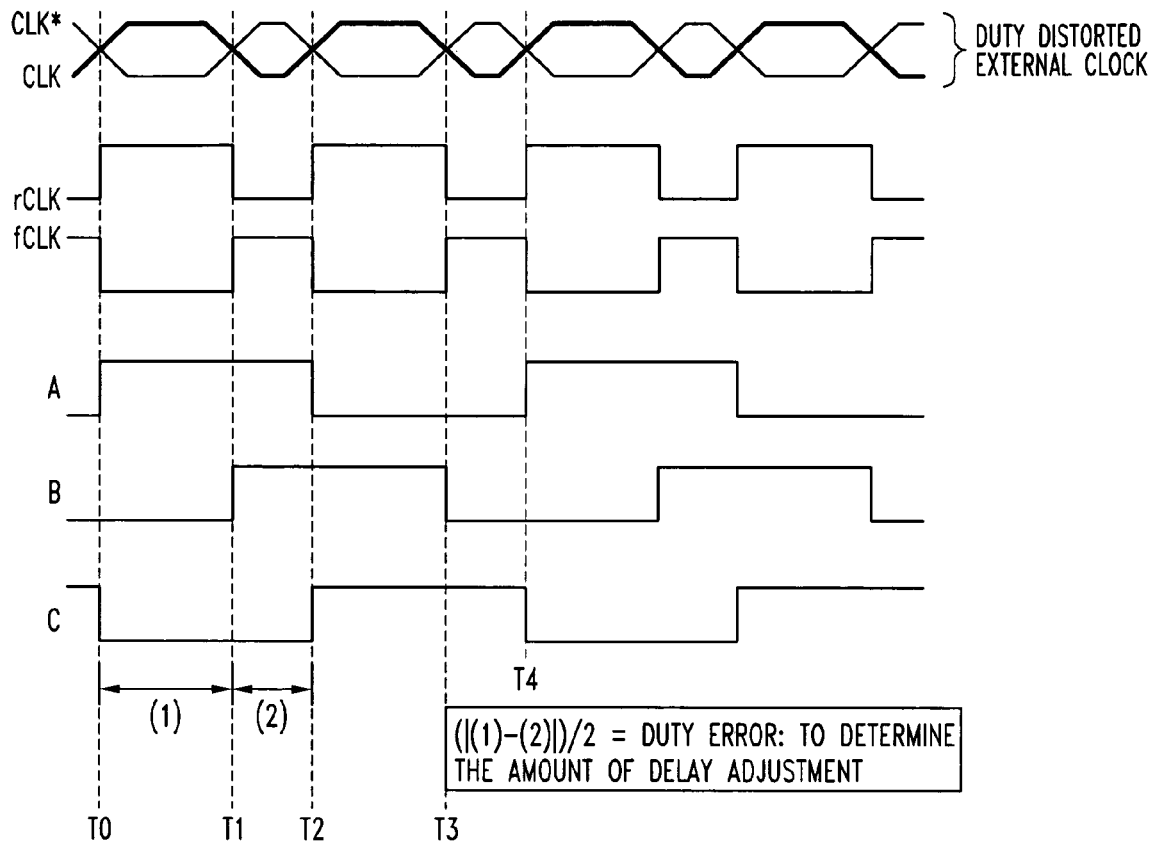
FIG. 5 is a timing diagram of various signals during operation of the clock generator of FIG. 3 in a locked state having duty cycle correction.

As shown in FIG. 5, the clock signal B is out of phase relative to the clock signal A by a delay (1) that corresponds to the time the CLK signal is high (and the CLK* signal is low). As further shown in FIG. 5, the clock signal C is out of phase relative to the clock signal B by a delay (2) that corresponds to the time the CLK* signal is high (and the CLK signal is low). The delays (1) and (2) are indicative of the duty cycle distortion in the CLK and CLK* signals, and exhibited in the rCLK and fCLK signals. As a result, the delays (1) and (2) can be used to calculate a duty cycle error from a desired 50% duty cycle. More specifically, the duty cycle error is equal to $(|1(1)-(2)|1)/2$. The delays (1) and (2) are measured using the delay lines 332, 336 and the phase detectors 340, 344. To measure the delay (1), delayed signal A (not shown) is compared to the clock signal B by the phase detector 340. The phase detector 340 will adjust the adjustable delay line 332 until the delayed signal A is in phase with the clock signal B, that is the rising edges of the delayed signal A and the clock signal B are aligned. Consequently, when the signals are in phase, the control signal output by the phase detector 340 to set the delay of the adjustable delay line 332 is indicative of the delay (1). Similarly, to measure the delay (2), the phase detector 344 compares the delayed signal B (not shown) to signal C. As with the phase detector 340 and the adjustable delay line 332, when the adjustable delay line 336 is adjusted by the phase detector 344 so that the delay signal B and the clock signal C are in phase, the control signal output by the phase detector 344 is indicative of the delay (2). The control signals output by the phase detectors 340, 344 are provided to the duty error calculator 356. As previously discussed, the correction for achieving a 50% duty cycle can be determined by calculating half the difference between the delays (1) and (2). This calculation is conducted by the duty error calculator 356, and is further described in the following sections.

Figure 6:
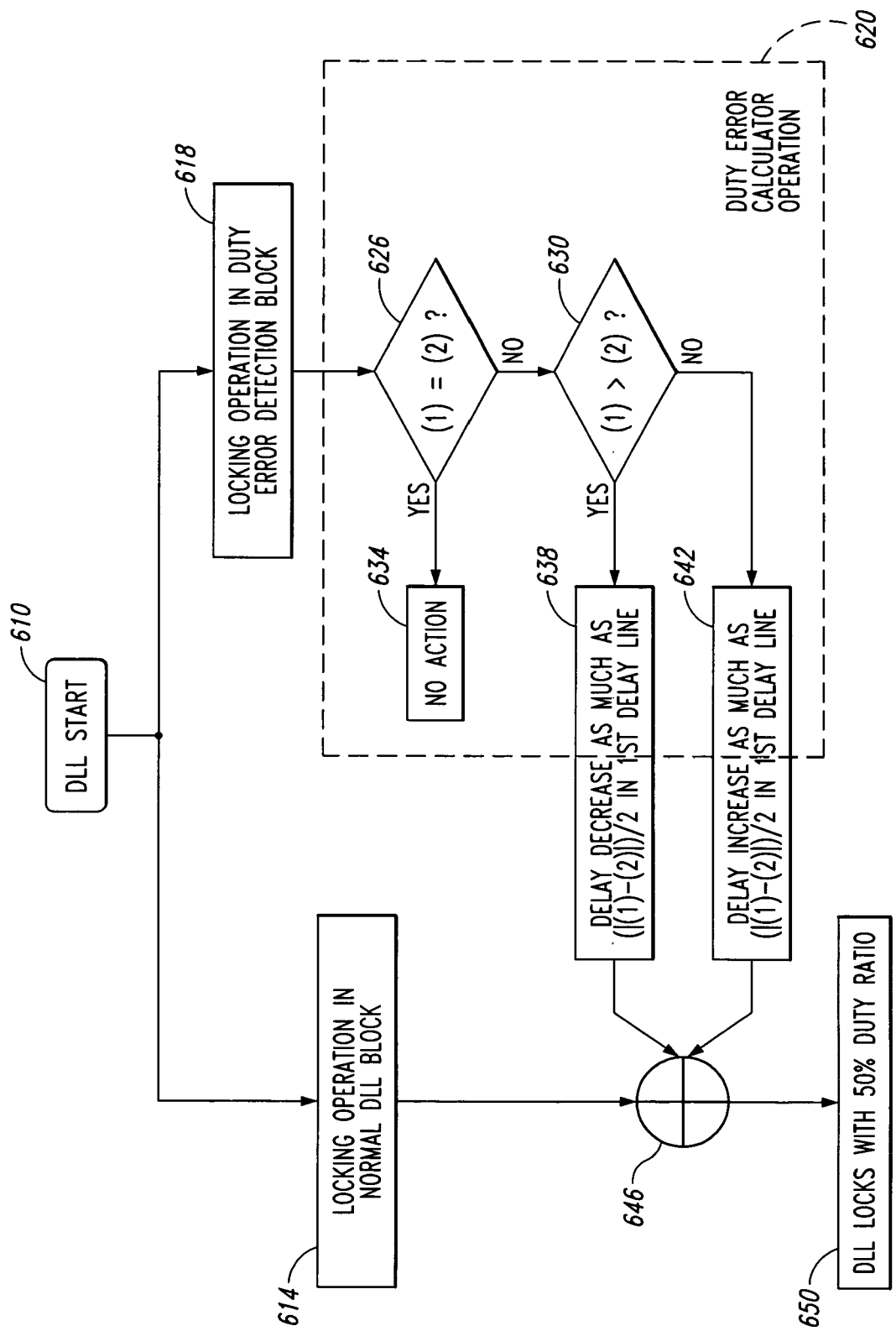
FIG. 6 is a flow diagram illustrating operation of duty cycle correction according to an embodiment of the invention.

The duty error calculation performed by the DCC circuit 308, will now be summarized with reference to the flow diagram in FIG. 6. FIG. 6 illustrates the parallel operation of the DLL 300 to obtain lock and of the DCC 308 to correct duty cycle error. At 610, the DLL 300 initiates the locking operation for the CLK and CLK* signals. The locking operation proceeds in the DLL 300 at 614. Although the DLL 300 obtains a locked state using the rCLK signal, the phase detector 380 and the shift register 372 set the adjustable delay of the delay lines 364, 368 using the same control signal so that the same amount of delay is provided by both delay lines 364, 368 to generate output clock signals fclk_sync and rclk_sync. The duty ratio of the fclk_sync and rclk_sync signals are equal to that of the CLK and CLK* signals. That is, uncorrected, the DLL 300 will generate clock signals fclk_sync and rclk_sync that are synchronized with the CLK and CLK* signals, but will include any duty cycle error the CLK and CLK* signals have. As the locking operation of the DLL 300 is performed, duty error correction is performed concurrently by the DCC circuit 308. At 618, the locking operation of the adjustable delay line 332 and the phase detector 340, and of the adjustable delay line 336 and the phase detector 344 is performed. When both the delay lines 332, 336 are locked, the output control signals by the phase detectors 332, 336 are indicative of the delays (1) and (2), respectively, and used by the duty error calculator 356 to correct for duty cycle error at 620.

The duty error calculator 356 compares the delays (1) and (2), and will generate an adjustment signal if necessary. At 626, if the delays (1) and (2) are equal, indicating that the rCLK and FCLK signals already have 50% duty cycles, no adjustment is made at 634 to achieve a 50% duty cycle. If however, at 630 the delays (1) and (2) are determined to be unequal, the adjustment signal is used to make an adjustment to the delay line 364 of the DLL 300 to correct the duty cycle error. When the delay (1) is greater than the delay (2), indicating a duty cycle of greater than 50% for the CLK signal, at 638 the adjustable delay of the delay line 364 in the DLL 300 is adjusted by the duty error calculator 356 to decrease the delay by an amount equal to one-half the difference between delays (1) and (2). In contrast, if the delay (2) is greater than the delay (1), indicating a duty cycle less than 50% for the CLK signal, the adjustable delay of the delay line 364 is increased by an amount equal to one-half the difference between delays (1) and (2). Note that only one of the two delay lines 364, 368 is adjusted by the duty error calculator 356 since the 50% duty cycle correction is achieved by changing the phase relationship of one output clock signal relative to the other. In the embodiment shown in FIG. 3, adjustment is made to the delay line 364 to change the phase of the fclk_sync signal relative to the rclk_sync signal. However, in alternative embodiments the inverse of this method is used. As illustrated by the present example, the locking operation of the DLL 300 and the locking operation of the DCC circuit 308 can occur concurrently. Although there are advantages to having the DLL 300 and the DCC circuit 308 operate concurrently, it is not required. Locking of the DLL 300 and the DCC circuit 308 can occur sequentially as well. In this case, there are still advantages to reducing clock jitter due to power supply noise since the rclk_and fclk_sync signals are generated by propagating through one respective adjustable delay line.

Figure 7:
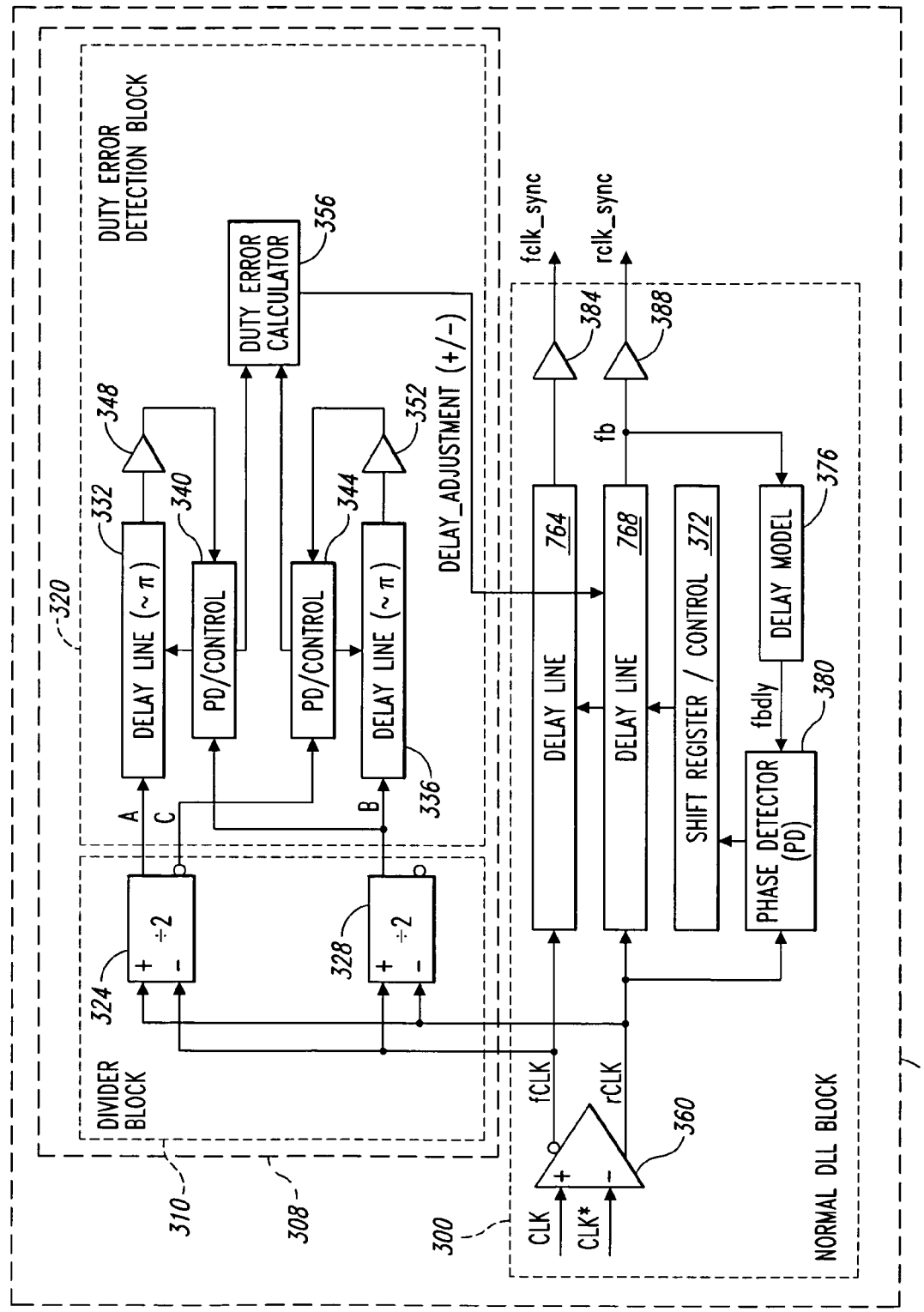
FIG. 7 is an alternate embodiment of the functional block diagram of a clock generator.
Figure 8:
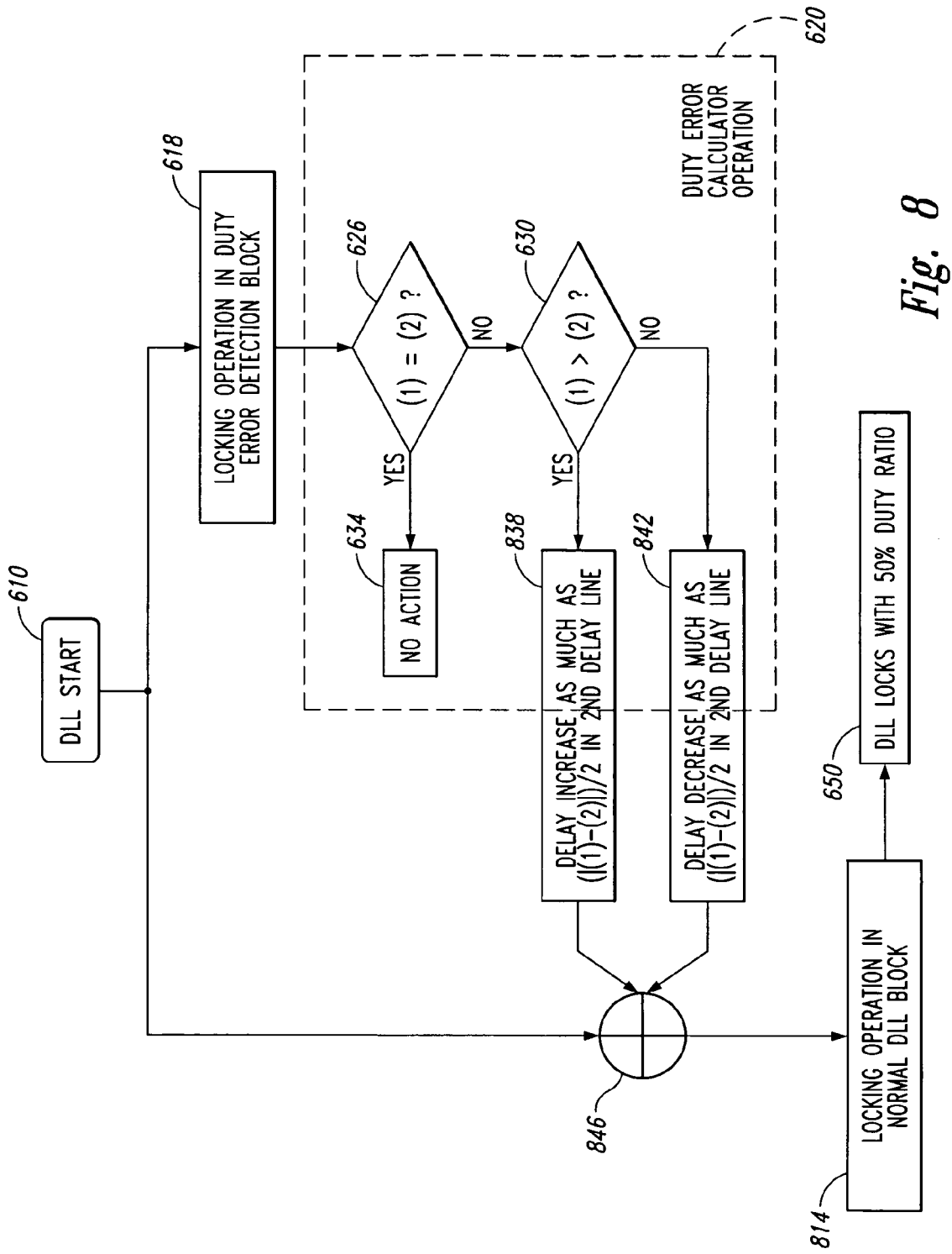
FIG. 8 is an alternate embodiment of a flow diagram illustrating operation of duty cycle correction.

FIG. 7 and FIG. 8 represent an alternate embodiment of the invention of the clock generator 302. Since the clock generator of FIG. 7 functions essentially in the same manner as the clock generator of FIG. 3, a detailed description of FIG. 7 is not provided herein in the interest of brevity. Only the elements distinguishable from the clock generator of FIG. 3 are described. Similarly, in the interest of brevity, a detailed description of the flow diagram of FIG. 8 is not provided herein, since it is similar to the flow diagram of FIG. 6. The distinguishable elements are described in further detail. As previously described, the inverse of the making an adjustment to delay line 364 (also 764) is to adjust the delay line 368 (also 768). However, providing an adjustment signal to the delay line 768 may have an effect on the normal function of the DLL 300 feedback loop. Since the DLL 300 corrects any phase difference between the output clock signals and applied input clock signals, the system will eventually compensate for any differences even as the duty error calculator 356 provides an additional delay. FIG. 8 illustrates the order of operation as the duty error calculator 356 provides the duty cycle adjustment signal first at 846, before the locking operation of the DLL 300 is fully achieved at 814. Additionally, by providing the adjustment signal to the delay line 768, the adjustment signal is also inverted. If the delays (1) and (2) are equal, then rCLK and fCLK signals have 50% duty cycles. However, when the delay (1) is greater than the delay (2), the duty cycle is less than 50% for the CLK signal, and at 838 the adjustable delay of the delay line 768 in the DLL 300 is adjusted by the duty error calculator to increase the delay by an amount equal to one-half the difference between delays (1) and (2). In the alternate embodiment, if the delay (2) is greater than delay (1), this indicates the duty cycle is greater than 50% for CLK signal, and the adjustable delay of the delay line 768 is decreased by an amount equal to one-half the difference between delays (1) and (2). Once again, only one of the two delay lines 754, 768 is adjusted by the duty error calculator 356.

Figure 9:
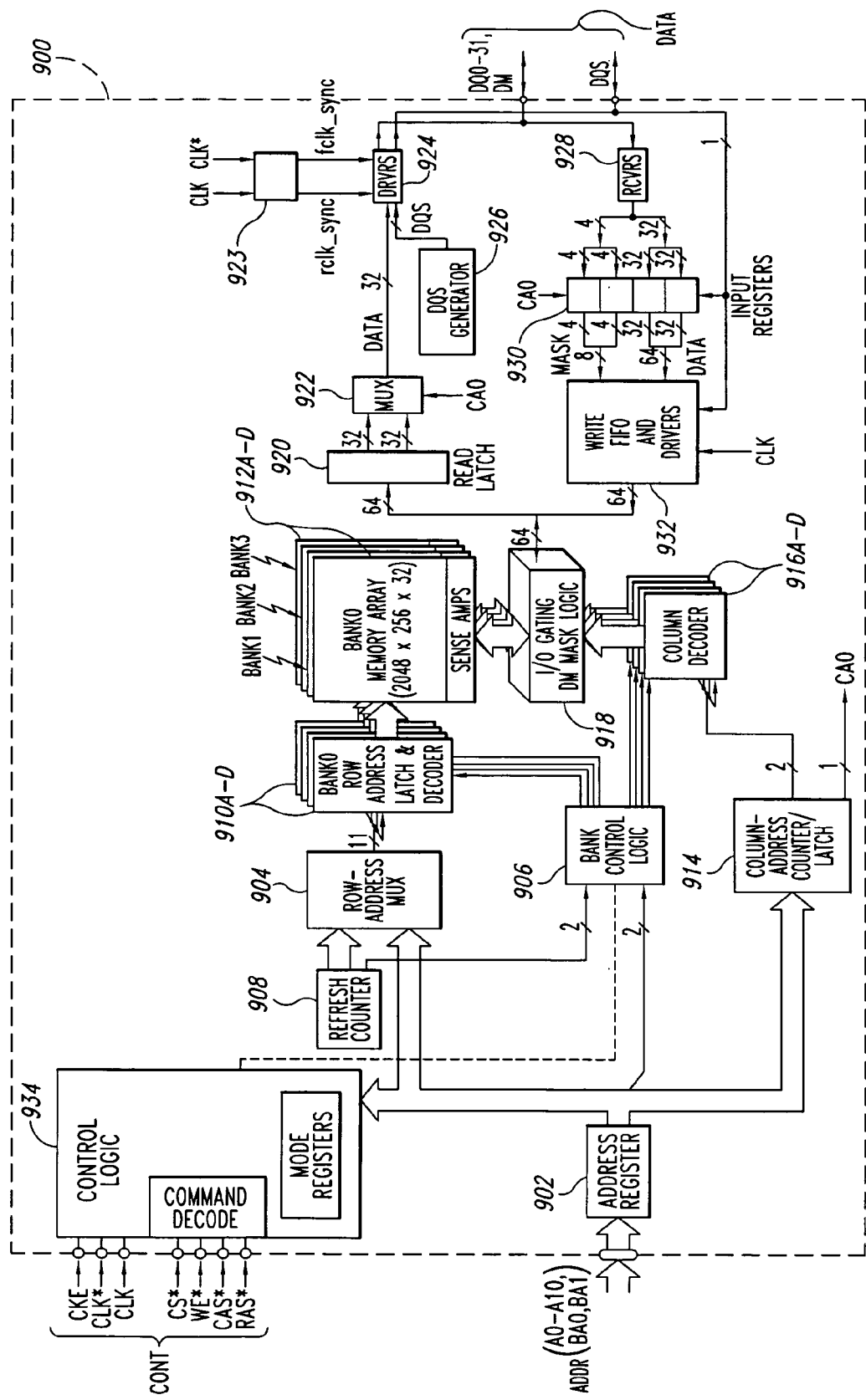
FIG. 9 is a functional block diagram illustrating a synchronous memory device including a clock generator according to an embodiment of the invention.

FIG. 9 is a functional block diagram of a memory device 900 including a clock generator 923 according to an embodiment of the present invention. The memory device 900 in FIG. 9 is a double-data rate ("DDR") SDRAM, although the principles described herein are applicable to any memory device that may include a delay-locked loop for synchronizing internal and external signals, such as conventional SDRAMs, as well as packetized memory devices like SLDRAMs and RDRAMs, and are equally applicable to any integrated circuit that must synchronize internal and external clocking signals.

The memory device 900 includes an address register 902 that receives row, column, and bank addresses over an address bus ADDR, with a memory controller (not shown) typically supplying the addresses. The address register 902 receives a row address and a bank address that are applied to a row address multiplexer 904 and bank control logic circuit 906, respectively. The row address multiplexer 904 applies either the row address received from the address register 902 or a refresh row address from a refresh counter 908 to a plurality of row address latch and decoders 910A–D. The bank control logic 906 activates the row address latch and decoder 910A–D corresponding to either the bank address received from the address register 902 or a refresh bank address from the refresh counter 908, and the activated row address latch and decoder latches and decodes the received row address. In response to the decoded row address, the activated row address latch and decoder 910A–D applies various signals to a corresponding memory bank 912A–D to thereby activate a row of memory cells corresponding to the decoded row address. Each memory bank 912A–D includes a memory-cell array having a plurality of memory cells arranged in rows and columns, and the data stored in the memory cells in the activated row is stored in sense amplifiers in the corresponding memory bank. The row address multiplexer 904 applies the refresh row address from the refresh counter 908 to the decoders 910A–D and the bank control logic circuit 906 uses the refresh bank address from the refresh counter when the memory device 900 operates in an auto-refresh or self-refresh mode of operation in response to an auto- or self-refresh command being applied to the memory device 900, as will be appreciated by those skilled in the art.

A column address is applied on the ADDR bus after the row and bank addresses, and the address register 902 applies the column address to a column address counter and latch 914 which, in turn, latches the column address and applies the latched column address to a plurality of column decoders 916A–D. The bank control logic 906 activates the column decoder 916A–D corresponding to the received bank address, and the activated column decoder decodes the applied column address. Depending on the operating mode of the memory device 900, the column address counter and latch 914 either directly applies the latched column address to the decoders 916A–D, or applies a sequence of column addresses to the decoders starting at the column address provided by the address register 902. In response to the column address from the counter and latch 914, the activated column decoder 916A–D applies decode and control signals to an I/O gating and data masking circuit 918 which, in turn, accesses memory cells corresponding to the decoded column address in the activated row of memory cells in the memory bank 912A–D being accessed.

During data read operations, data being read from the addressed memory cells is coupled through the I/O gating and data masking circuit 918 to a read latch 920. The I/O gating and data masking circuit 918 supplies N bits of data to the read latch 920, which then applies two N/2 bit words to a multiplexer 922. The circuit 918 provides 64 bits to the read latch 920 which, in turn, provides two 32 bits words to the multiplexer 922. A data driver 924 sequentially receives the N/2 bit words from the multiplexer 922 and also receives a data strobe signal DQS from a strobe signal generator 926 and a delayed complementary clock signals fclk_sync and rclk_sync from the clock generator 923. The DQS signal is used by an external circuit such as a memory controller (not shown) in latching data from the memory device 900 during read operations. In response to the delayed complementary clock signals fclk_sync and rclk_sync, the data driver 924 sequentially outputs the received N/2 bits words as a corresponding data word DQ, each data word being output in synchronism with rising and falling edges of the CLK and CLK* signals that are applied to clock the memory device 900. The data driver 924 also outputs the data strobe signal DQS having rising and falling edges in synchronism with rising and falling edges of the CLK and CLK* signals, respectively. Each data word DQ and the data strobe signal DQS collectively define a data bus DATA. As will be appreciated by those skilled in the art, the fclk_sync and rclk_sync signals from the DLL are delayed versions of the complementary CLK and CLK* signals, and the clock generator 923 adjusts the delay of the fclk_sync and rclk_sync signals relative to the CLK and CLK* signals to ensure that the DQS signal and the DQ words are placed on the DATA bus in synchronism with the CLK and CLK* signals, as previously described. The DATA bus also includes masking signals DMO-M, which will be described in more detail below with reference to data write operations.

During data write operations, an external circuit such as a memory controller (not shown) applies N/2 bit data words DQ, the strobe signal DQS, and corresponding data masking signals DM on the data bus DATA. A data receiver 928 receives each DQ word and the associated DM signals, and applies these signals to input registers 930 that are clocked by the DQS signal. In response to a rising edge of the DQS signal, the input registers 930 latch a first N/2 bit DQ word and the associated DM signals, and in response to a falling edge of the DQS signal the input registers latch the second N/2 bit DQ word and associated DM signals. The input register 930 provides the two latched N/2 bit DQ words as an N-bit word to a write FIFO and driver 932, which clocks the applied DQ word and DM signals into the write FIFO and driver in response to the DQS signal. The DQ word is clocked out of the write FIFO and driver 932 in response to the CLK signal, and is applied to the I/O gating and masking circuit 918. The I/O gating and masking circuit 918 transfers the DQ word to the addressed memory cells in the accessed bank 912A–D subject to the DM signals, which may be used to selectively mask bits or groups of bits in the DQ words (i.e., in the write data) being written to the addressed memory cells.

A control logic and command decoder 934 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 934 latches and decodes an applied command, and generates a sequence of clocking and control signals that control the components 902–932 to execute the function of the applied command. The clock enable signal CKE enables clocking of the command decoder 934 by the clock signals CLK, CLK*. The command decoder 934 latches command and address signals at edges of the CLK, CLK* signals (i.e., the crossing point of CLK going high and CLK* going low), while the input registers 930 and data drivers 924 transfer data into and from, respectively, the memory device 900 in response to both edges of the data strobe signal DQS and thus at double the frequency of the clock signals CLK, CLK*. This is true because the DQS signal has the same frequency as the CLK, CLK* signals. The memory device 900 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 934 in generating the control and timing signals is conventional, and thus, for the sake of brevity, will not be described in more detail.

Figure 10:
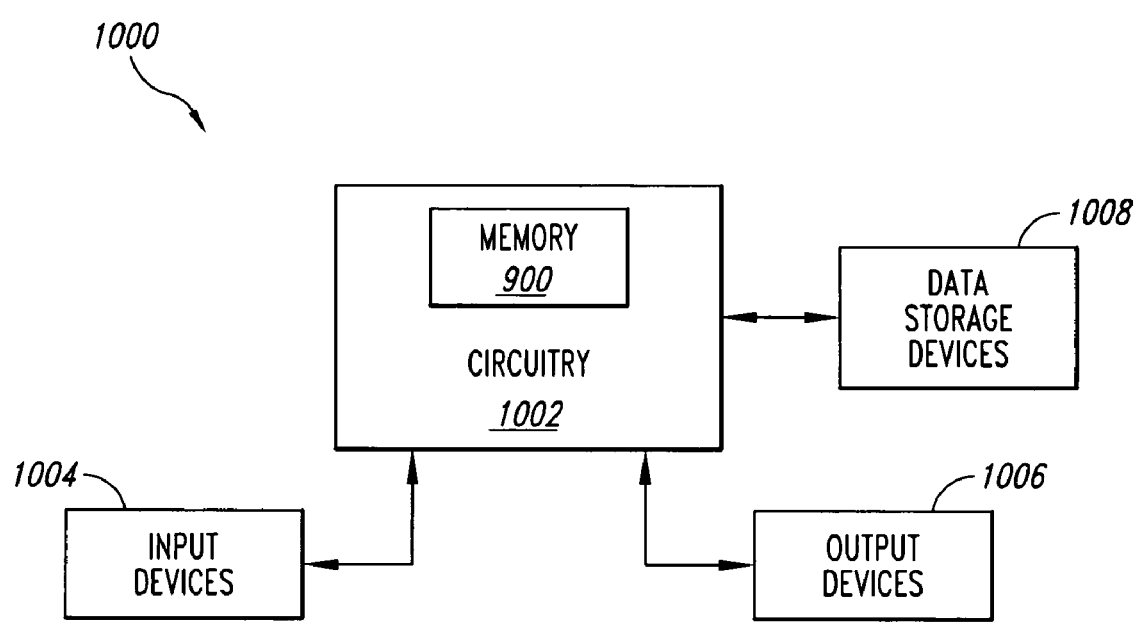
FIG. 10 is a functional block diagram illustrating a processor-based system including the synchronous memory device of FIG. 9.

FIG. 10 is a block diagram of a processor-based system 1000 including processor circuitry 1002, which includes the memory device 900 of FIG. 9. Typically, the processor circuitry 1002 is coupled through address, data, and control buses to the memory device 900 to provide for writing data to and reading data from the memory device. The processor circuitry 1002 includes circuitry for performing various processing functions, such as executing specific software to perform specific calculations or tasks. In addition, the processor-based system 1000 includes one or more input devices 1004, such as a keyboard or a mouse, coupled to the processor circuitry 1002 to allow an operator to interface with the processor-based system 1000. Typically, the processor-based system 1000 also includes one or more output devices 1006 coupled to the processor circuitry 1002, such as output devices typically including a printer and a video terminal. One or more data storage devices 1008 are also typically coupled to the processor circuitry 1002 to store data or retrieve data from external storage media (not shown). Examples of typical storage devices 1008 include hard and floppy disks, tape cassettes, compact disk read-only ("CD-ROMs") and compact disk read-write ("CD-RW") memories, and digital video disks ("DVDs").

From the foregoing it will be appreciated that, although specific embodiments of the invention have been described herein for purposes of illustration, various modifications may be made without deviating from the spirit and scope of the invention. Such modifications are well within the skill of those ordinarily skilled in the art. Accordingly, the invention is not limited except as by the appended claims.

What is claimed is:

1. A clock generator, comprising:
   a delay locked loop having first and second inputs to which first and second input clock signals are respectively applied, the first and second input clock signals complementary, the delay locked loop further having first and second outputs at which the first and second output clock signals are provided and first and second adjustable delay circuits coupled to respective inputs and outputs, the delay locked loop configured to adjust the first adjustable delay circuit to generate a first output clock signal synchronized with the first input clock signal and configured to adjust the second adjustable delay circuit to provide a delay equal to the first adjustable delay circuit; and
   a duty cycle correction circuit coupled to the first and second inputs of the delay locked loop and further coupled to the second adjustable delay circuit, the duty cycle correction circuit configured to determine a duty cycle error of at least one of the first and second input clock signals and adjust the second adjustable delay circuit to provide a corrected delay compensating for the duty cycle error.

2. The clock generator in claim 1 wherein the delay locked loop comprises:
   an input buffer having first and second inputs coupled to the first and second input clock signals respectively, the input buffer further having first and second outputs, the input buffer configured to generate buffered clock signals;
   an output buffer having first and second inputs coupled to the outputs of the first and second adjustable delay circuits respectively, the output buffer configured to generate the first and second output clock signals; and
   a feedback control circuit having a first input coupled to the output of the first output of the input buffer and a second input coupled to the output of the first adjustable delay circuit, the feedback control circuit configured to provide a control signal to the first and second adjustable delay circuits to generate a signal delay to synchronize the first output clock signal with the first input clock signal.

3. The clock generator in claim 2 wherein the feedback control circuit comprises:
   a model delay circuit having an input coupled to the output of the first adjustable delay circuit and having an output, the model delay circuit configured to generated a delayed clock signal having a fixed delay relative to the delayed clock signal of the first adjustable delay circuit;
   a phase detector having a first input coupled to the output of the model delay circuit, a second input coupled to the first output of the input buffer, and the phase detector further having an output, the phase detector configured to generate the control signal relative to the phase difference between the buffered clock signal of the input buffer and the fixed delay signal of the model delay circuit; and
   a shift register having an input coupled to the output of the phase detector and further having at least one output coupled to the first adjustment delay circuit and the at least one output coupled simultaneously to the second adjustment delay circuit, the shift register configured to generate a delay adjustment signal according to the control signal provided by the phase detector.

4. The clock generator in claim 1 wherein the duty cycle correction circuit comprises:
   a first frequency divider circuit having at least one input coupled to at least one output of the input buffer of the delay locked loop, and further having at least one output, the first frequency divider circuit configured to generate at least one frequency-divided clock signal having a clock frequency less than the input clock signal;
   a second frequency divider circuit having at least one input coupled to at least one output of the input buffer of the delay locked loop, and further having at least one output, the second frequency divider configured to receive an input clock signal opposite to the input clock signal received by the first frequency divider circuit, the second frequency divider circuit configured to generate at least one frequency-divided clock signal having a clock frequency less than the input clock signal; and an adjustable duty error detection loop having at least one input corresponding to the output of each frequency divider circuit, and further having an output coupled to the second adjustable delay circuit of the delay locked loop, the adjustable duty error detection loop configured to provide an adjustment signal to the delay locked loop to correct the duty cycle error of the input clock signals.

5. The clock generator in claim 4 wherein the adjustable duty error detection circuit comprises:

a first adjustable delay circuit having an input coupled to the output of the first frequency divider circuit and further having an output, the first adjustable delay circuit configured to have a number of delay lines less than the number of delay lines in the adjustable delay circuits of the delay locked loop, the first adjustable delay circuit configured to generate a delayed clock signal relative to the output clock signal of the first frequency divider circuit;

a second adjustable delay circuit having an input coupled to the output of the second frequency divider circuit and further having an output, the second adjustable delay circuit configured to have a number of delay lines less than the number of delay lines in the adjustable delay circuits of the delay locked loop, the second adjustable delay circuit configured to generate a delayed clock signal relative to the output clock signal of the second frequency divider circuit;

a first phase detector having a first input coupled to the output of the first adjustable delay circuit and a second input coupled to the output of the second divider circuit, the first phase detector further having at least one output, the first phase detector configured to generate a first control signal indicative of the phase difference of the two signals received;

a second phase detector having a first input coupled to the output of the second adjustable delay circuit and a second input coupled to the output of the first divider circuit, the second phase detector further having at least one output, the second phase detector configured to generate a second control signal indicative of the phase difference of the two signals received; and a duty error calculator having a first input coupled to the output of the first phase detector, a second input coupled to the output of the second phase detector, and further having an output, the duty error calculator operable to determine a duty cycle error of the input clock signal relative to the complimentary input clock signal and to generate an adjustment signal equal to one-half of the time delay indicative of the duty cycle error.

6. The clock generator in claim 5 wherein the first and second phase detectors further comprises third and fourth outputs coupled to the first and second adjustable delay circuits, the third and fourth outputs configured to provide a delay signal to synchronize the first and second input signals.

7. The clock generator in claim 4 wherein the duty cycle correction circuit is further configured to provide an adjustment signal to the feedback loop of the delay locked loop to adjust one of the output clock signals to correct the duty cycle error relative each other.

8. A clock generator for generating a set of output clock signals synchronized with a corresponding set of input clock signals and having a corrected duty cycle, the clock generator comprising:

an input buffer having an input and output corresponding in number to each of the input clock signals, the input buffer receiving the input clock signals and configured to generate buffered input clock signals corresponding to each input clock signal;

an output buffer having an input and an output corresponding in number to each of the input clock signals, the output buffer configured to generate an output clock signal in response to each of the inputs;

a delay locked loop having at least two inputs coupled to the outputs of the input buffer and having two outputs coupled to the input of a respective one of the output buffers, the delay-locked loop further having a feedback delay loop configured to generate an adjustable delay relative to the buffered input clock signals and further configured to be adjusted to synchronize the output clock signals to corresponding input clock signals and provide first and second delayed buffered input clock signals; and a duty cycle correction circuit having a frequency divider circuit coupled to each output of the input buffer to receive buffered input clock signals, the duty cycle correction circuit further having a feedback circuit configured to determine a duty cycle error of the input clock signals and to generate a control signal provided to the feedback delay loop to adjust a phase relationship of at least one of the delayed buffered input clock signals relative to the other delayed buffered input clock signal.

9. The clock generator in claim 8 wherein the input buffer comprises:

a first input to receive a first clock signal, and a second input to receive a second clock signal out of phase relative to the first clock signal by 180 degrees, the input buffer further having a first output and a second output, the input buffer configured to generate a first buffered clock signal and a second buffered clock signal out of phase from the first buffered clock signal by 180 degrees.

10. The clock generator in claim 8 wherein the delay locked loop comprises:

a first adjustable delay circuit having a first input coupled to the first output of the input buffer and a second input to receive a delay adjustment signal, the first adjustable delay circuit further having an output coupled to the first input of the output buffer, the first adjustable delay circuit configured to generate a delayed clock signal that is relative to the first buffered clock signal;

a second adjustable delay circuit having a first input coupled to the second output of the input buffer and a second input to receive the delay adjustment signal, the second adjustable delay circuit further having an output coupled to the second input of the output buffer, the second adjustable delay circuit configured to generate a delayed clock signal with a delay equal to the delay provided by the first adjustable delay circuit;

a delay model circuit having an input coupled to the output of the first adjustable delay circuit and further having an output, the delay model circuit configured to generate a delayed clock signal having a fixed delay relative to the output clock signal of the first adjustable delay circuit;

a phase detector circuit having a first input coupled to the output of the delay model circuit and a second input coupled to the first output of the input buffer, the phase detector circuit further having an output, the phase detector circuit configured to determine the phase difference between the first buffered input clock signal and the delayed clock signal provided by the delay model circuit and generate a control signal indicative of the phase difference; and a shift register control circuit having an input coupled to the output of the phase detector circuit and an output coupled to the first and second adjustable delay circuits, the shift register control circuit configured to generate the delay adjustment signal according to the control signal from the phase detector circuit.

11. The clock generator in claim 8 wherein the duty cycle correction circuit comprises:

a first frequency divider circuit having a first input coupled to a first output of the input buffer and having a second input coupled to a second output of the input buffer, the first frequency divider circuit further having at least one output, the first frequency divider circuit configured to generate at least one clock signal having a clock frequency one-half the clock frequency of the buffered input clock signals provided by the input buffer;

a second frequency divider circuit having a first input coupled to the second output of the input buffer and having a second input coupled to the first output of the input buffer, the second frequency divider circuit further having at least one output, the second frequency divider circuit configured to generate at least one clock signal having a clock frequency one-half the clock frequency of the buffered input clock signals provided by the input buffer;

a first adjustable delay circuit and a second adjustable delay circuit each having an input to receive the output clock signal provided by a respective frequency divider circuit, the first and second adjustable delay circuits each having an output, each adjustable delay circuit configured to provide respective clock signals having respective delays relative to the respective divided signals provided by the respective frequency divider circuit;

a first phase detector circuit and a second phase detector circuit each having a first input to receive a corresponding delayed clock signal from the first and second adjustable delay circuits respectively, each phase detector circuit further having a second input to receive a divided clock signal from the frequency divider circuit inverse to the frequency divider circuit providing the input signal for the delayed clock signal of the first input, the first and second phase detector circuits configured to determine the phase difference between the clock signals provided to the first and second inputs and generate a delay adjustment signal provided to the respective adjustable delay circuit; and a duty error calculator having a first input coupled to the output of the first phase detector circuit, a second input coupled to the output of the second phase detector circuit and an output coupled to an adjustable delay circuit of the delay locked loop; the duty error calculator configured to determine the duty cycle error by calculating half the difference between the time delay of the first and second inputs, the duty error calculator further configured to provide an adjustment signal to correct the duty cycle of the first adjustable delay circuit of the delay locked loop.

12. The clock generator in claim 11 wherein the first frequency divider further includes a second output, the first frequency divider configured to generate a second clock signal complimentary to the first clock signal output.

13. The clock generator in claim 11 wherein the duty cycle correction adjusts the first output clock signal of the delay locked loop relative to the second output clock signal of the delay locked loop, an edge of the first output clock signal is equally spaced in time of corresponding edges of the second output clock signal.

14. The clock generator in claim 11 wherein the duty error calculator comprises:

a first delay input, a second delay input and an output, the duty error calculator configured to generate a delay adjustment signal by decreasing the delay signal as much as half the time difference of the first and second inputs when the first input is greater than the second input, increasing the delay signal a much as half the time difference of the first and second inputs when the first input is less than the second input and taking no action when the first delay input is equal to the second delay input.

15. A method for generating first and second duty cycle corrected output clock signals in response to first and second input clock signals, the method comprising:

determining a time delay equal to a duty cycle error of at least one of the first and second input clock signals;

delaying the first input clock signal by a first delay to provide the first output clock signal in phase with the first input clock signal; and delaying the second input clock signal by a second delay to provide the second output clock signal having phase relative to the first output clock signal that corrects the duty cycle error, the second delay equal to the first delay adjusted by one-half of the time delay equal to the duty cycle error.

16. The method of claim 15 wherein determining the time delay comprises generating a first divided signal responsive to the first input clock signal, generating a second divided signal responsive to the second input clock signal, and generating a third signal complimentary to the first divided signal.

17. The method of claim 15 wherein determining the time delay further comprises measuring the first delay by comparing the first delayed signal to the second divided signal by a first phase detector and measuring the second delay by comparing the second delayed signal to the third complimentary signal by a second phase detector, determining the time delay further comprises comparing the difference of the first delay to the second delay by a duty error calculator.

18. The method of claim 16 wherein the first divided signal comprises generating a signal by receiving the input clock signal at the rising edge of the first input clock signal and the falling edge of the second input clock signal.

19. The method of claim 16 wherein the second divided signal is the inverse of the first divided signal.

20. A method of calculating the duty error, the method comprising:

generating first and second divided signals having a divided frequency relative to the applied input clock signals;

delaying the first and second divided signals relative to the first and second applied input clock signals;

generating a third signal complimentary to the first signal;
determining the duty cycle error by comparing the first delay of the first signal relative to the second signal and comparing the second delay of the second signal relative to the first signal, and further determining the total delay by comparing the difference of the first delay to the second delay; and
generating a duty cycle adjustment signal by taking half the difference of the first delay to the second delay;
propagating the duty cycle adjustment signal to a delay locked loop circuit to generate output signals that are synchronized with the applied input clock signals and having corrected duty cycles.

21. The method of claim 20 wherein the first and second divided signals are generated by changing a signal between first and second levels in response to a rising edge of one input clock signal and a falling edge of the other input clock signal.

22. The method of claim 20 wherein determining the duty cycle error comprises comparing clock signals using at least one phase detector to adjust the respective delay until a first input signal of the phase detector is in phase with a second input signal, the phase detector further generating a control signal indicative of the measured delay.

23. The method of claim 20 wherein generating the duty cycle adjustment signal comprises comparing the value of the first delay to the value of the second delay, generating a control signal to decrease a delay adjustment when the first delay is greater than the second delay, generating a control signal to increase the delay adjustment when the first delay is less than the second delay, and generating a control signal to make no adjustment when the first delay is equal to the second delay.

24. The method of claim 20 wherein generating output signals with corrected duty cycle comprises adjusting a phase relationship of one output signal relative to the other output signal to have a clock edge of the one output signal equally spaced in time between clock edges of the other output signal.

25. A memory device, comprising:
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit; and
a clock generator coupled to the control circuit, the clock generator configured to generate a set of output clock signals synchronized with a corresponding set of input clock signals and having an adjusted duty cycle, the clock generator comprising:
a delay locked loop having first and second inputs to which first and second input clock signals are respectively applied, the first and second input clock signals complimentary, the delay locked loop further having first and second outputs at which the first and second output clock signals are provided and first and second adjustable delay circuits coupled to respective inputs and outputs, the delay locked loop configured to adjust the first adjustable delay circuit to generate a first output clock signal synchronized with the first input clock signal and configured to adjust the second adjustable delay circuit to provide a delay equal to the first adjustable delay circuit; and a duty cycle correction circuit coupled to the first and second inputs of the delay locked loop and further coupled to the second adjustable delay circuit, the duty cycle correction circuit configured to determine a duty cycle error of at least one of the first and second input clock signals and adjust the second adjustable delay circuit to provide a corrected delay compensating for the duty cycle error.

26. The memory device of claim 25 wherein the delay locked loop comprises:
an input buffer having first and second inputs coupled to the first and second input clock signals respectively, the input buffer further having first and second outputs, the input buffer configured to generate buffered clock signals;
an output buffer having first and second inputs coupled to the outputs of the first and second adjustable delay circuits respectively, the output buffer configured to generate the first and second output clock signals; and
a feedback control circuit having a first input coupled to the output of the first output of the input buffer and a second input coupled to the output of the first adjustable delay circuit, the feedback control circuit configured to provide a control signal to the first and second adjustable delay circuits to generate a signal delay to synchronize the first output clock signal with the first input clock signal.

27. The memory device of claim 26 wherein the feedback control circuit comprises:
a model delay circuit having an input coupled to the output of the first adjustable delay circuit and having an output, the model delay circuit configured to generated a delayed clock signal having a fixed delay relative to the delayed clock signal of the first adjustable delay circuit;
a phase detector having a first input coupled to the output of the model delay circuit, a second input coupled to the first output of the input buffer, and the phase detector further having an output, the phase detector configured to generate the control signal relative to the phase difference between the buffered clock signal of the input buffer and the fixed delay signal of the model delay circuit; and
a shift register having an input coupled to the output of the phase detector and further having at least one output coupled to the first adjustment delay circuit and the at least one output coupled simultaneously to the second adjustment delay circuit, the shift register configured to generate a delay adjustment signal according to the control signal provided by the phase detector.

28. The memory device of claim 25 wherein the duty cycle correction circuit comprises:
a first frequency divider circuit having at least one input coupled to at least one output of the input buffer of the delay locked loop, and further having at least one output, the first frequency divider circuit configured to generate at least one frequency-divided clock signal having a clock frequency less than the input clock signal;
a second frequency divider circuit having at least one input coupled to at least one output of the input buffer of the delay locked loop, and further having at least one output, the second frequency divider configured to receive an input clock signal opposite to the input clock signal received by the first frequency divider circuit, the second frequency divider circuit configured to generate at least one frequency-divided clock signal having a clock frequency less than the input clock signal; and an adjustable duty error detection loop having at least one input corresponding to the output of each frequency divider circuit, and further having an output coupled to the second adjustable delay circuit of the delay locked loop, the adjustable duty error detection loop configured to provide an adjustment signal to the delay locked loop to correct the duty cycle error of the input clock signals.

29. The memory device of claim 28 wherein the adjustable duty error detection circuit comprises:

a first adjustable delay circuit having an input coupled to the output of the first frequency divider circuit and further having an output, the first adjustable delay circuit configured to have a number of delay lines less than the number of delay lines in the adjustable delay circuits of the delay locked loop, the first adjustable delay circuit configured to generate a delayed clock signal relative to the output clock signal of the first frequency divider circuit;

a second adjustable delay circuit having an input coupled to the output of the second frequency divider circuit and further having an output, the second adjustable delay circuit configured to have a number of delay lines less than the number of delay lines in the adjustable delay circuits of the delay locked loop, the second adjustable delay circuit configured to generate a delayed clock signal relative to the output clock signal of the second frequency divider circuit;

a first phase detector having a first input coupled to the output of the first adjustable delay circuit and a second input coupled to the output of the second divider circuit, the first phase detector further having at least one output, the first phase detector configured to generate a first control signal indicative of the phase difference of the two signals received;

a second phase detector having a first input coupled to the output of the second adjustable delay circuit and a second input coupled to the output of the first divider circuit, the second phase detector further having at least one output, the second phase detector configured to generate a second control signal indicative of the phase difference of the two signals received; and a duty error calculator having a first input coupled to the output of the first phase detector, a second input coupled to the output of the second phase detector, and further having an output, the duty error calculator operable to determine a duty cycle error of the input clock signal relative to the complimentary input clock signal and to generate an adjustment signal equal to one-half of the time delay indicative of the duty cycle error.

30. The memory device of claim 29 wherein the first and second phase detectors further comprises third and fourth outputs coupled to the first and second adjustable delay circuits, the third and fourth outputs configured to provide a delay signal to synchronize the first and second input signals.

31. The memory device of claim 28 wherein the duty error calculator is configured to provide an adjustment signal to the feedback loop of the delay locked loop to adjust one of the output clock signals to correct the duty cycle error relative each other.

32. A processor-based system, comprising:
a data input device;
a data output device;
a processor coupled to the data input and output devices; and
a memory device coupled to the processor, the memory device comprising;
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit; and
a clock generator coupled to the control circuit, the clock generator configured to generate an output clock signal synchronized with a n input clock signal and having a corrected duty cycle, the clock generator comprising:

a delay locked loop having first and second inputs to which first and second input clock signals are respectively applied, the first and second input clock signals complimentary, the delay locked loop further having first and second outputs at which the first and second output clock signals are provided and first and second adjustable delay circuits coupled to respective inputs and outputs, the delay locked loop configured to adjust the first adjustable delay circuit to generate a first output clock signal synchronized with the first input clock signal and configured to adjust the second adjustable delay circuit to provide a delay equal to the first adjustable delay circuit; and a duty cycle correction circuit coupled to the first and second inputs of the delay locked loop and further coupled to the second adjustable delay circuit, the duty cycle correction circuit configured to determine a duty cycle error of at least one of the first and second input clock signals and adjust the second adjustable delay circuit to provide a corrected delay compensating for the duty cycle error.

33. The processor based system of claim 32 wherein the delay locked loop comprises:

an input buffer having first and second inputs coupled to the first and second input clock signals respectively, the input buffer further having first and second outputs, the input buffer configured to generate buffered clock signals;

an output buffer having first and second inputs coupled to the outputs of the first and second adjustable delay circuits respectively, the output buffer configured to generate the first and second output clock signals; and a feedback control circuit having a first input coupled to the output of the first output of the input buffer and a second input coupled to the output of the first adjustable delay circuit, the feedback control circuit configured to provide a control signal to the first and second adjustable delay circuits to generate a signal delay to synchronize the first output clock signal with the first input clock signal.

34. The processor based system of claim 33 wherein the feedback control circuit comprises:

a model delay circuit having an input coupled to the output of the first adjustable delay circuit and having an output, the model delay circuit configured to generated a delayed clock signal having a fixed delay relative to the delayed clock signal of the first adjustable delay circuit;

a phase detector having a first input coupled to the output of the model delay circuit, a second input coupled to the first output of the input buffer, and the phase detector further having an output, the phase detector configured to generate the control signal relative to the phase difference between the buffered clock signal of the input buffer and the fixed delay signal of the model delay circuit; and a shift register having an input coupled to the output of the phase detector and further having at least one output coupled to the first adjustment delay circuit and the at least one output coupled simultaneously to the second adjustment delay circuit, the shift register configured to generate a delay adjustment signal according to the control signal provided by the phase detector.

35. The processor based system of claim 32 wherein the duty cycle correction circuit comprises:

a first frequency divider circuit having at least one input coupled to at least one output of the input buffer of the delay locked loop, and further having at least one output, the first frequency divider circuit configured to generate at least one frequency-divided clock signal having a clock frequency less than the input clock signal;

a second frequency divider circuit having at least one input coupled to at least one output of the input buffer of the delay locked loop, and further having at least one output, the second frequency divider configured to receive an input clock signal opposite to the input clock signal received by the first frequency divider circuit, the second frequency divider circuit configured to generate at least one frequency-divided clock signal having a clock frequency less than the input clock signal; and an adjustable duty error detection loop having at least one input corresponding to the output of each frequency divider circuit, and further having an output coupled to the second adjustable delay circuit of the delay locked loop, the adjustable duty error detection loop configured to provide an adjustment signal to the delay locked loop to correct the duty cycle error of the input clock signals.

36. The processor based system of claim 35 wherein the adjustable duty error detection circuit comprises:

a first adjustable delay circuit having an input coupled to the output of the first frequency divider circuit and further having an output, the first adjustable delay circuit configured to have a number of delay lines less than the number of delay lines in the adjustable delay circuits of the delay locked loop, the first adjustable delay circuit configured to generate a delayed clock signal relative to the output clock signal of the first frequency divider circuit;

a second adjustable delay circuit having an input coupled to the output of the second frequency divider circuit and further having an output, the second adjustable delay circuit configured to have a number of delay lines less than the number of delay lines in the adjustable delay circuits of the delay locked loop, the second adjustable delay circuit configured to generate a delayed clock signal relative to the output clock signal of the second frequency divider circuit;

a first phase detector having a first input coupled to the output of the first adjustable delay circuit and a second input coupled to the output of the second divider circuit, the first phase detector further having at least one output, the first phase detector configured to generate a first control signal indicative of the phase difference of the two signals received;

a second phase detector having a first input coupled to the output of the second adjustable delay circuit and a second input coupled to the output of the first divider circuit, the second phase detector further having at least one output, the second phase detector configured to generate a second control signal indicative of the phase difference of the two signals received; and a duty error calculator having a first input coupled to the output of the first phase detector, a second input coupled to the output of the second phase detector, and further having an output, the duty error calculator operable to determine a duty cycle error of the input clock signal relative to the complimentary input clock signal and to generate an adjustment signal equal to one-half of the time delay indicative of the duty cycle error.

37. The processor based system of claim 36 wherein the first and second phase detectors further comprises third and fourth outputs coupled to the first and second adjustable delay circuits, the third and fourth outputs configured to provide a delay signal to synchronize the first and second input signals.

38. The processor based system of claim 35 wherein the duty error calculator is configured to provide an adjustment signal to the feedback loop of the delay locked loop to adjust one of the output clock signals to correct the duty cycle error relative each other.

\* \* \* \* \*